US012658274B2

(12) United States Patent
Zeli et al.

(10) Patent No.: US 12,658,274 B2
(45) Date of Patent: Jun. 16, 2026

(54) MEMORY SYSTEM WITH REDUNDANT OPERATION

(71) Applicant: NXP USA, INC., Austin, TX (US)

(72) Inventors: Rodrigo Pascoal Zeli, Sao jose dos Campos (BR); Qadeer Qureshi, Dripping Springs, TX (US); Henning Fritz Spruth, Austin, TX (US); Reinaldo Silveira, São Paulo (BR)

(73) Assignee: NXP USA, Inc., Austin, TX (US)

( * ) Notice: Subject to any disclaimer, the term of this patent is extended or adjusted under 35 U.S.C. 154(b) by 897 days.

(21) Appl. No.: 17/187,979

(22) Filed: Mar. 1, 2021

(65) Prior Publication Data

US 2022/0277800 A1    Sep. 1, 2022

(51) Int. Cl.
| | |
|---|---|
| *G11C 29/42* | (2006.01) |
| *G11C 7/10* | (2006.01) |
| *G11C 29/14* | (2006.01) |
| *G11C 29/44* | (2006.01) |

(52) U.S. Cl.
CPC ............ *G11C 29/42* (2013.01); *G11C 7/1012* (2013.01); *G11C 29/14* (2013.01); *G11C 29/44* (2013.01)

(58) Field of Classification Search
CPC ......... G11C 29/12; G11C 29/14; G11C 29/42; G11C 29/44
See application file for complete search history.

(56) References Cited

U.S. PATENT DOCUMENTS

| | | | |
|---|---|---|---|
| 5,416,741 A | 5/1995 | Oshawa | |
| 7,216,277 B1 | 5/2007 | Ngai et al. | |
| 8,289,792 B2 | 10/2012 | Kudou | |
| 10,665,316 B2 | 5/2020 | Nakaoka | |
| 2001/0028584 A1 | 10/2001 | Nakayama et al. | |
| 2002/0110027 A1 | 8/2002 | Nakano et al. | |
| 2003/0206470 A1* | 11/2003 | Leader ................... | G11C 29/72 |
| | | | 365/201 |
| 2004/0076042 A1 | 4/2004 | Wu et al. | |
| 2018/0314595 A1 | 11/2018 | Eichmeyer et al. | |
| 2019/0227121 A1 | 7/2019 | Azam et al. | |
| 2019/0371424 A1 | 12/2019 | Mathur et al. | |

* cited by examiner

*Primary Examiner* — Alfredo Bermudez Lozada
(74) *Attorney, Agent, or Firm* — David G. Dolezal

(57) ABSTRACT

A memory system includes a memory that provides digital data and a built-in self-test (BIST) circuit for testing the memory for determining defective storage units of the memory. The memory system has a data output for providing data from the memory to an external system. The data output of the memory system has a first bit width. The memory has a data output that has a second bit width that is greater than the first bit width. The BIST circuit has a data input that is of the second bit width.

20 Claims, 3 Drawing Sheets

301 — TEST ALL MEMORY CELLS

303 — CALCULATE AND APPLY REPAIR

401 — TEST NON REDUNDANT MEMORY CELLS

403 — CALCULATE AND APPLY REPAIR

405 — RE-CHECK REPAIRED MEMORY INCLUDING REDUNDANT CELLS ADDED FOR THE REPAIR

MEMORY SYSTEM WITH REDUNDANT OPERATION

BACKGROUND OF THE INVENTION

Field of the Invention

This invention relates in general to a memory system.

Background

Memories include memory cells for storing data and outputs for providing data in a digital form. Some memories include redundant circuitry such as redundant rows or columns that can be used to provide replacement cells which can be used if the memory has defective memory cells.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory system includes a memory that provides digital data and a built-in self-test (BIST) circuit for testing the memory for determining defective storage units of the memory. The memory system has a data output for providing data from the memory to an external system. The data output of the memory system has a first bit width. The memory has a data output that has a second bit width that is greater than the first bit width. The BIST circuit has a data input that is of the second bit width.

In one embodiment, providing a memory system with both a memory having a larger bit width data output than the system memory and a BIST circuit with a larger bit width data input than the data output of the system memory, may provide redundancy to the memory system and also provide simplification of BIST operations for detecting defective storage units of the memory by allowing redundant and all non redundant cells of an addressable memory location to be tested at the same time.

Figure 1:
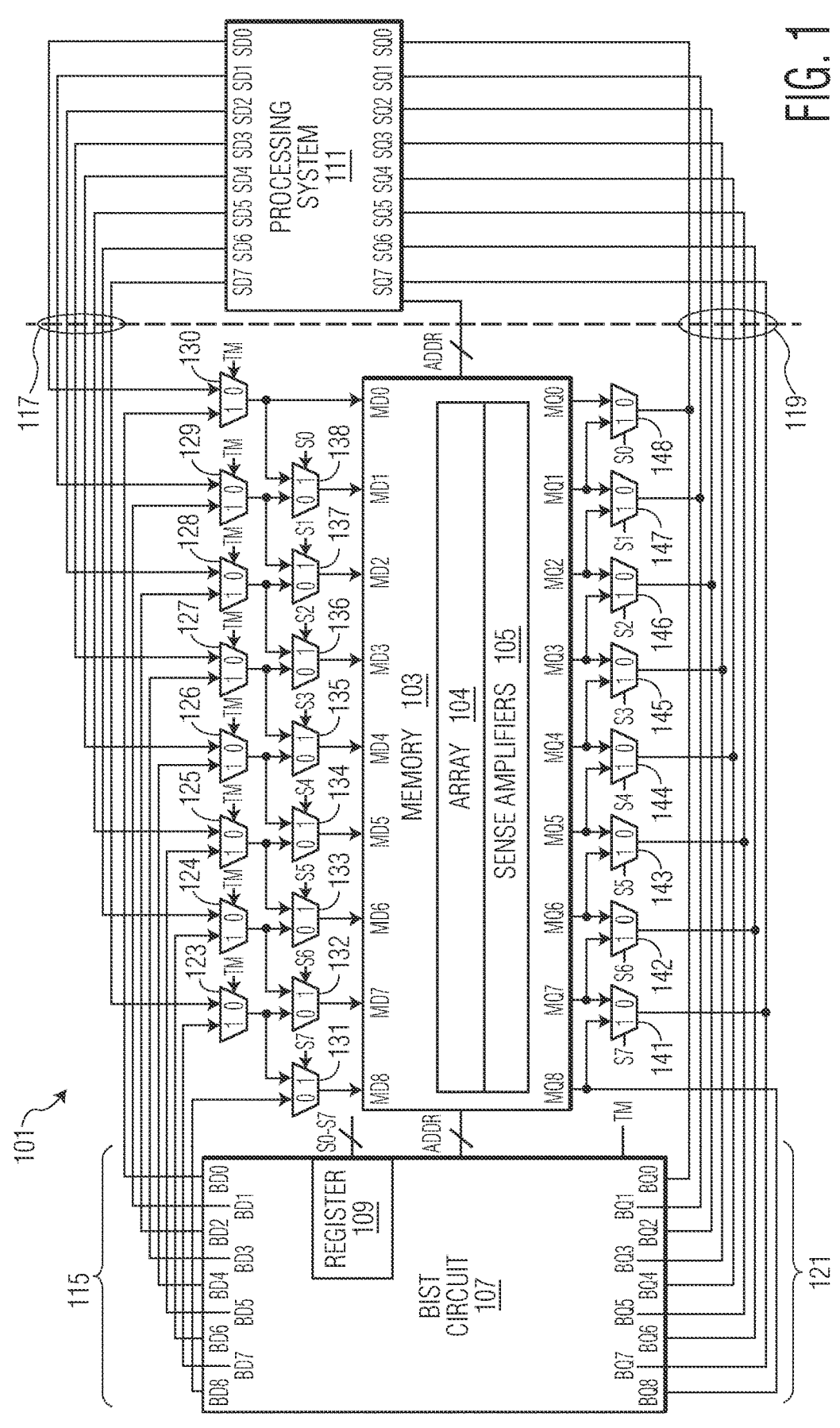
FIG. 1 is a circuit diagram of a memory system and processing system according to one embodiment of the present invention.

FIG. 1 is circuit diagram of a memory system 101 and processing system 111 according to one embodiment of the present invention. Memory system includes a memory 103 and built-in self-test (BIST) circuit 107. Memory 103 includes an array of data storage units (e.g. memory cells)

104 for storing data and read circuitry (which in the embodiment shown are sense amplifiers 105) for providing digital data stored in array 104 on memory output terminals MQ0-MQ8 during a memory read operation. In the embodiment shown, memory 103 has a data input that includes data input terminals MD0-MD8 for receiving data to be written to array 104 during a memory write operation. In the embodiment shown, memory 103 includes two address inputs, one coupled to address lines (ADDR) from BIST circuit 107 and the other coupled to address lines (ADDR) from processing system 111 for receiving addresses for accessing an addressable storage location during a read or write operation. In other embodiments, the memory would include only one address input where the address data lines from BIST circuit 107 and from processing system 111 would be selectively applied to the address input (e.g. by a multiplexer circuit (not shown)) depending upon whether BIST circuit 107 or processing system 111 is initiating the memory operation.

Memory array 104 includes a plurality of memory storage units (e.g. cells) arranged in rows and columns for storing data at addressable memory locations. The memory cells of array 104 may be volatile or nonvolatile. Examples of memory cell types of the cells of array 104 may include SRAM, DRAM, MRAM, ReRAM, phase change memory, flash, and one-time programmable memory cells such as an array of fuses. Not shown FIG. 1 are column decoders, row decoders, write circuitry, and a memory controller of memory 103, all whose configuration would depend on the type of memory cells of array 104.

In the embodiment shown, memory 103 has a nine-bit width data input (MD0-MD8) and a nine-bit width data output (MQ0-MQ8). However, memory 103 may have inputs and outputs of other bit widths in other embodiments (e.g. 10, 17, 18, 33, 65 and 66). Also, memory 103 may include column decoders (not shown) allowing for a greater number of columns than the number of input and output terminals. For example, array 104 may include eight columns of cells (or other multiple) per each input and output terminal pair. In one embodiment, cells of each of the eight columns would be accessible via the input/output terminal pair though column decode circuitry (not shown). In one embodiment, memory array 104 has 1024 rows, but may have a different number in other embodiments.

In one embodiment, memory 103 is a non repairable memory. A non repairable memory is a memory that does not include redundant cells (e.g. rows or columns) and redirection circuitry where a redundant cell can be selectively used though the redirection circuitry of the memory to store data in place of a defective cell for an addressable storage location of the memory for memory operations.

Processing system 111 includes circuitry for issuing memory operation instructions to memory system 101. In the embodiment shown, the instructions are sent on a data bus that includes data write lines (originating from data terminals SD0-SD7 of the data output of processing system 111), data read lines (originating from data terminals SQ0-SQ7 of the data input of processing system 111), address lines (ADDR), and control lines (not shown in FIG. 1). In other embodiments, processing system 111 may only include one set of data terminals for both read and write data. In one embodiment, processing circuitry is a processing unit of a microcontroller where memory system 101 is located on the same integrated circuit as processing system 111. In other embodiments, processing circuitry is part of a microprocessor located on a separate integrated circuit. In other embodiments, processing circuitry is a DMA for moving data between memory systems. In some embodiments, memory system 101 is a cache for processing system 111. In other embodiments, memory system 101 is the system memory. In still other embodiments, memory system 101 may be a nonvolatile system memory for a system with processing system 111.

BIST circuit 107 performs operations on memory 103 during a test mode to determine whether any of the memory cells of array 104 are defective and therefore are not reliable for storing data. In one embodiment, BIST circuit 107 issues read instructions to read the data of the cells of memory array 104 (via data input terminals BQ0-BQ8) and writes data (supplied via data output terminals BD0-BD8) to memory 103. In some embodiments, BIST circuit 107 writes data to an addressable storage location of array 104 and then reads the data from the addressable storage location to determine whether a cell is defective. In some embodiments, during the testing operations, memory 103 is placed under stressed conditions (e.g. over voltage, under voltage, timing) to determine the cells that are defective and are likely to fail. BIST circuit 107 stores in register 109 an indication of the cells that are defective. The address of the memory reads and memory writes by BIST circuit 107 is supplied via the address signals (ADDR). Not shown are control signals provided by BIST circuit 107 to memory 103 for performing the memory operations.

Memory system 101 includes multiplexers 123-130 which are utilized to selectively provide either data from processing system 111 or data from BIST circuit 107 to memory 103 for performing memory writes. In the embodiment shown, multiplexers 123-130 are controlled by a TM signal to place memory system 101 in a test mode (indicated by a high voltage state of the TM signal) where write data is received from BIST circuit 107 or in a normal mode (indicated by a low voltage state of the TM signal) where write data is received via memory system input 117 from processing system 111. In some embodiments, data terminal BD8 of BIST circuit 107 is coupled to a dummy multiplexer (not shown) which would provide the same delay as multiplexers 123-130. In one embodiment, the TM signal is generated by processing system 111. In other embodiments, the TM signal is generated by a system controller (not shown).

In the embodiment shown, memory system 101 utilizes the identification of the defective cells in array 104 to control the redirection circuitry to provide repaired memory storage locations to replace the identified defective cells. In the example shown, memory system 101 includes redirection circuitry that redirects the data lines from the memory system data input 117 and memory system data output 119 to the data inputs and outputs, respectively, of memory 103 so as to avoid the defective cells of array 104. In the embodiment shown, the redirection circuitry includes multiplexers 131-138 for selectively redirecting the data lines from system data input 117 (through multiplexers 123-130) to the memory data input terminals MD0-MD8 that are not coupled to the defective memory location. In addition, the redirection circuitry includes multiplexers 141-148 for selectively redirecting the data lines from the memory data output terminals MQ0-MQ8 to the system data output 119 so that data from a memory data output terminal (MQ0-MQ8) coupled to a defection storage location is not provided to system data output 119. In some embodiments, memory data input terminal MD0 is coupled to a dummy multiplexer to provide a similar delay as multiplexers 131-138 and memory data output terminal MQ8 is coupled to a dummy multiplexer to provide a similar delay as multiplexers 141-148.

In the embodiment shown, the bit width of system data input 117 and system data output 119 is eight bits and the bit width of memory data input (MD0-MD8) and memory data output (MQ0-MQ8) is nine bits to provide an extra bit for redundancy in case a defective cell is found by BIST circuit 107. For example, if a defective cell was found in a memory cell associated with input terminal MD4 and output terminal MQ4, then the redirection circuitry would not make those terminals accessible to the system input 117 or the system output 119, respectively. Instead, the cells associated with terminals MD8 and MQ8 would be used as replacement cells for the addressable storage locations.

In one such an example where terminals MD4 and MQ4 are associated with a defective memory cell, register 109 would output values S0-S7 to control multiplexers 131-138 to couple system processing data output terminals SD0-SD7 to memory data input terminals MD0-MD3 and MD5-MD8 respectively during memory operations initiated by processing system 111. To accomplish this shift, register 109 outputs signals S0-S7 as 00001111 such that the data lines from processor output terminals SD4-SD7 are redirected to memory input terminals MD5-MD8. In the embodiment shown, the data line from system output terminal SD4 is redirected to memory input terminal MD5 by multiplexer 134, the data line from system output terminal SD5 is redirected to memory input terminal MD6 by multiplexer 133, the data line from system output terminal SD6 is redirected to memory input terminal MD7 by multiplexer 132, and the data line from system output terminal SD7 is redirected to memory input terminal MD8 by multiplexer 131.

Likewise, signals S0-S7 being at the values of 00001111 would control multiplexers 148-141 couple the data input terminals SQ0-SQ7 of processing system 111 to the data output terminals MQ0-MQ3 and MQ5-MQ8, respectively, thus, bypassing memory output data terminal MQ4.

In other embodiments, the bit width of the memory input and output may be greater than the bit width of the system input 117 and output 119 by two bits or greater to provide a memory system with a greater redundancy.

Figure 2:
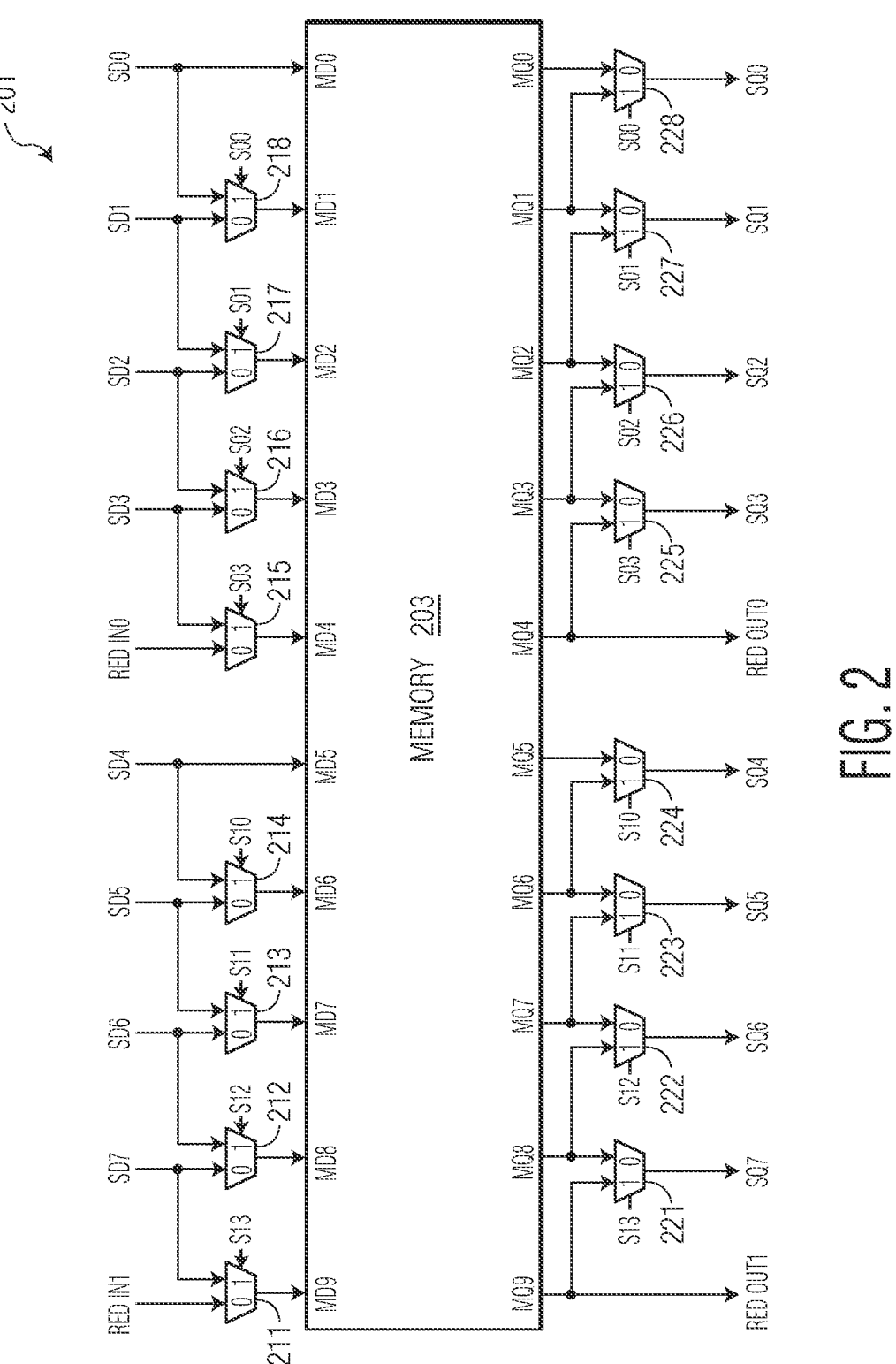
FIG. 2 is a circuit diagram of a memory and data line redirection circuitry according to another embodiment of the present invention.

FIG. 2 is a circuit diagram of a memory 203 and redirection circuitry according to another embodiment of the present invention. Memory 203 includes ten memory input terminals MD0-MD9 and ten memory output terminals MQ0-MQ9. FIG. 2 shows input redirection circuitry that includes eight multiplexers 211-218 for selectively providing an eight-bit wide data word (on lines SD0-SD7) from a processing system (not shown) to eight of the input terminals (MD0-MD9) of memory 203 for writing into memory cells of memory 203. FIG. 2 also shows output redirection circuitry that includes eight multiplexers 221-228 for selectively providing an eight bit wide data word from eight of the output terminals (MQ0-MQ9) of memory 203 to a processing system (not shown) on system data lines SQ0-SQ7 for reading data from memory cells of memory 203.

In the embodiment shown, the redirection circuitry enables the memory cells associated with one input terminal/output terminal pair of memory 203 to serve as redundant cells for cells associated four other input terminal/output terminal pairs of a memory. For example, in FIG. 2, memory cells associated with memory input terminal MD4 and memory output terminal MQ4 serve as redundant cells for the memory cells associated with memory inputs/output terminal pairs MD0/MQ0 to MD3/MQ3. Thus, if a defective cell is found by a BIST circuit coupled to memory 203 (not shown in FIG. 2), the data from a processing system (on lines SD0-SD3) to be written to memory 203 is redirected from that memory input terminal (of terminals MD0-MD3) associated with the defective cell and the output data provided to a system processor (on lines SQ0-SQ3) does not include data from the memory data output terminal (of terminals MQ0-MQ3) associated with the defective cell. The memory cells associated with memory terminals MD9 and MQ9 function the same way for the memory cells associated with the memory data terminal pairs MD5/MQ5-MD8/MQ8.

In the embodiment of FIG. 2, a BIST circuit (not shown) would have ten output data terminals, one each for terminals MD0-MD9 and would have ten input data terminals, one each for terminals MQ0-MQ9. In one embodiment similar to FIG. 1, some of the output data terminals of the BIST circuit and the data lines SD0-SD7 would be connected to multiplexers (similar to multiplexers 123-130 of FIG. 1) for selectively providing data to memory 201 depending upon the mode of operation.

The configuration in FIG. 2 shows one example of a memory redundancy scheme in which up to two defective bits can be bypassed and correct data provided to the processing system (not shown). However, other memory systems may have other memory redundancy schemes and/or other redundancy ratios in other embodiments.

Figure 3:
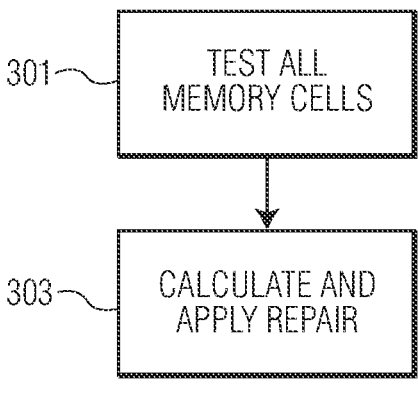
FIG. 3 is a flow diagram showing the operation of a memory system according to one embodiment of the present invention.

FIG. 3 is a flow diagram showing test mode operations of a memory system 101 during an initialization operation that may be performed e.g. after the manufacture of a system with memory system 101 and prior to being sold to an end user. However, the initialization operation of FIG. 3 may be performed at other times in other embodiments.

In operation 301, BIST circuit 107 tests all memory cells (including redundant cells) of memory 103 to determine if any of the memory cells are defective. In one embodiment, BIST circuit 107 writes a value to selected cells of a row by providing data to each of the memory data input terminals (MD0-MD8) during a number of memory write operations. In performing these writes, the TM signal is asserted and register 109 is programmed with all zeros such that none of the signal lines to terminals MD0-MD8 are redirected by multiplexers 131-138. In one embodiment, the write operations (and/or subsequent storage) may be performed under stress conditions (e.g. overvoltage, undervoltage, clocking conditions) that are different from normal memory operating conditions. After all of the cells of array 104 have been written to, BIST circuit 107 reads each cell by reading the values from each of the output data terminals (MQ0-MQ8) over several read operations. In one embodiment, BIST circuit 107 writes all 1's to the memory cells of array 104 during the tests and reads the cells to see if the cells produce that value. In other embodiments, BIST circuit 107 writes all 0s. In still other embodiments, BIST circuit 107 may write an alternating pattern of 1s and 0s. In some embodiments, BIST circuit 107 may write all 1s to the cells of array 104 during one pass and write all 0s to the cells during a second pass to determine if both values can be stored in a cell. Other tests for determining a defective cell may be performed in other embodiments.

In operation 303, if a defective cell is found in operation 301, BIST circuit 107 calculates and writes a repair value in register 109. Writing a value to register 109 sets the values of signals S0-S7 such that the multiplexers 131-138 are configured so that the data input memory terminal (of terminals MD0-MD8) associated with the defective memory cell does not receive data from the system data input 117 and such that multiplexers 141-148 are configured so that the memory data output terminal (of terminals MQ0-MQ8) associated with the defective memory cell does not provide data to the system data output 119. In some embodiments after operation 303, the test mode is complete. In other embodiments, a retest may be performed in the repaired condition.

In other embodiments, the test mode of FIG. 3 may be performed at other times. For example, the test mode of FIG. 3 may be performed during the use of memory system 101 (e.g. during a down time, during power up, during power down, or at regularly scheduled intervals) to determine whether any cells have become defective during the use of the memory system. In some embodiments, BIST circuit 107 would test the memory with the redirection circuitry in the configuration set from the previous repair. For example, during a subsequent test, multiplexers 131-138 and 141-148 are in the repair configuration based on the detected defective cell found in operation 301 (as set by signals S0-S7) from a previous test.

In some embodiments, if the memory cannot be repaired due to an insufficient number of redundant memory cells needed to replace the detected defective cells, BIST circuit 107 may provide an error signal to processing system 111 stating that the memory is defective.

Figure 4:
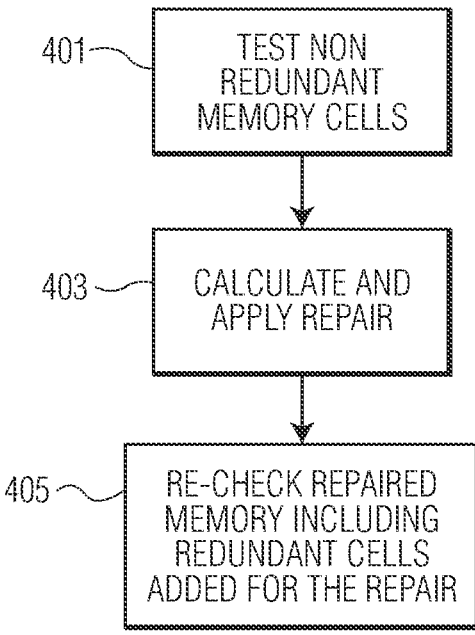
FIG. 4 is a flow diagram showing the operation of a memory system according to the prior art.

FIG. 4 is a flow diagram showing test mode operations according to the prior art for checking and repairing a memory system. The memory system (not shown) that performs the test operations of FIG. 4 includes a repairable memory and a BIST circuit that has the same number of input and output data terminals as the repairable memory. At operation 401, only the non redundant data cells of the repairable memory are tested by the BIST circuit. If a defective cell is found during operation 401, then in operation 403, a repair with redundant memory cells is made to the repairable memory. In operation 405, the repaired memory with the added redundant memory cells is tested to determine if the repair worked (i.e. there were no erroneous redundant cells added for the repair).

As compared to the prior art test operations of FIG. 4, the test operations of FIG. 3 do not require that the memory be retested so that the redundant memory cells added for the repair can be tested. Accordingly, the test and repair operations can be simplified.

Providing a memory system that includes a BIST circuit and a memory with inputs and outputs having a greater bit width than the memory system data inputs and outputs may in some embodiments provide for a memory system with simplified test mode operations. In some conventional systems where the BIST data inputs and outputs have a bit width that is the same as the bit width of the system memory data inputs and outputs, the testing of the data cells is more complex and requires more operations in that multiple test passes are needed to ensure that all of the cells (both redundant and non redundant) of a memory are covered. If these operations are performed under stress conditions, then the cells (such as with flash cells) may be unevenly worn during the testing.

In some embodiments, where the memory is a non repairable memory, providing the memory system with external redirection circuitry may allow for a simplified system for accessing the cells of a memory used for redundancy. With conventional memory systems that provide redundancy with redirection circuitry in the memory itself, extra operations and circuitry may be needed for accessing and testing the redundant cells in the memory. For example, a conventional memory may include the redirection circuitry before the sense amplifiers. However, such circuitry and operations may not be needed in some embodiments of the present invention in that the non repairable memory does not include redundant cells with internal redirection circuitry and all cells of the memory are accessible to the BIST circuit via its input and output terminals during a read or write of addressable storage locations of a row.

Also, using a non repairable memory and redirection circuitry that is external to the memory may allow for memory systems to be designed with simpler, non repairable memories where the addition (if customer desired) of redundancy can be added with the addition of multiplexers to the data lines. This way, the number of memory designs for a company can be reduced in that all circuits can be designed with a simpler, non repairable memory whether redundancy is required or not. Furthermore, with memory systems having external redirection circuitry, the redirection circuitry can be utilized with memories of any memory cell type where the complexity of providing a memory system with redundancy is not dependent on cell type.

A memory system may have other circuitry, other configurations, and/or operate in other ways in other embodiments. For example, other embodiments may utilize a multiport memory that can be written to and read from at the same time. In other embodiments, the redirection circuitry may be implemented with other types of circuitry such as shifters.

In one embodiment, a memory system includes a memory including an array of memory storage units, read circuitry for providing digital outputs of data stored in the array, and a memory data output for providing digital data read by the read circuitry from the array at an addressable memory location. The memory data output being of a first bit width. The memory system includes a system data output for providing data from an addressable memory location of the array indicated by an address received at a system address input. The system data output is of a second bit width less than the first bit width. The memory system including a built-in self-test circuit including a data input to receive data from the memory data output. The data input of the built-in self-test circuit having the first bit width, wherein the built-in self-test circuit is operably coupled to the memory to perform test operations on the memory to determine defective storage units of the memory.

In another embodiment, a method of operating a memory system includes performing memory test operations. The performing the memory test operations include writing by a built-in self-test circuit, data having a first bit width to a memory of a memory system. The memory receives the data at a memory data input of the memory having the first bit width. The performing the memory test operations include reading by the built-in self-test circuit, data having the first bit width from a memory data output of the memory. The memory data output of the memory being of the first bit width. The memory data output of the memory providing digital data. The memory system has a system data input and a system data output having a second bit width that is less than the first bit width.

In still another embodiment, a memory system includes a memory including an array of memory storage units, read circuitry for providing digital outputs of data stored in the array, and a memory data output for providing digital data read by the read circuitry from the array at an addressable memory location. The memory data output being of a first bit width. The memory system includes a system data output for providing data from an addressable memory location of the array indicated by an address received at a system address input. The system data output is of a second bit width less than the first bit width.

In another embodiment, the memory system includes a system data input to receive data to be written to the array at an addressable memory location indicated by an address received at the system address input. The system data input is of the second bit width. The memory including a memory data input for receiving data to be written to the array at an addressable memory location including data received from the system data input. The memory data input being of the first bit width. The memory system includes a built-in self-test circuit including a data input to receive data from the memory data output. The data input of the built-in self-test circuit having the first bit width. The built-in self-test circuit including a data output to provide data to the memory data input to write to the array. The built-in self-test circuit is operably coupled to the memory to perform test operations on the memory to determine defective storage units of the array. The memory system includes data line redirection circuitry configurable to provide data received from the system data input to terminals of the memory data input wherein terminals of the memory data input associated with defective storage units of the array as determined by the built-in self-test circuit are not provided data received from the system data input, and configurable to provide data provided to the system data output from terminals of the memory data output wherein data from terminals of the memory data output associated with defective storage units of the array determined by the built-in self-test circuit are not provided to the system data output.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory system comprising:
a memory including an array of memory storage units, read circuitry for providing digital outputs of data stored in the array, and a memory data output for providing digital data read by the read circuitry from the array at an addressable memory location, the memory data output being of a first bit width;
a system data output for providing data from an addressable memory location of the array indicated by an address received at a system address input, the system data output being of a second bit width less than the first bit width;
a built-in self-test circuit including a data input to receive data having the first bit width from the memory data output, the data input of the built-in self-test circuit having the first bit width, wherein the built-in self-test circuit is operably coupled to the memory to perform test operations on the memory to determine defective storage units of the memory.

2. The memory of claim 1 further comprising:
data line redirection circuitry for selectively redirecting at least one data line to the system data output from a corresponding data terminal of the memory data output based upon a determination by the built-in self-test circuit that a storage unit of the memory is a defective.

3. The memory system of claim 2 wherein the data line redirection circuitry reduces a bit width of the data read from the memory data output from the first bit width to the second bit width in providing the data to the system output.

4. The memory system of claim 2 wherein the data line redirection circuitry includes a plurality of multiplexers.

5. The memory system of claim 4 wherein each of the plurality of multiplexers includes two inputs coupled to two different data terminals of the memory data output.

6. The memory system of claim 2 further comprising a control register for storing an indication that a storage unit of the memory is defective as determined by the built-in self-test circuit where the indication is provided to the data line redirection circuitry for selectively redirecting at least one data line of the system data output from a corresponding memory data output terminal for a memory operation.

7. The memory system of claim 1 wherein the memory is characterized as a non repairable memory.

8. The memory system of claim 1 further comprising:
a system data input to receive data to be written to the array at an addressable memory location indicated by an address received at the system address input, the system data input being of the second bit width;
wherein the memory includes a memory data input for receiving data to be written to the array at an addressable memory location, the memory data input being of the first bit width.

9. The memory system of claim 8 wherein the built-in self-test circuit includes a data output for providing data to be written to the array during a test operation, the data output of the built-in self-test circuit being of the first bit width.

10. The memory system of claim 9 further comprising data input selection circuitry for selecting data to provide to the memory data input between data from the system data input or data from the data output of the built-in self-test circuit.

11. The memory system of claim 10 wherein the data input selection circuitry includes a plurality of multiplexers where each multiplexer of the plurality is coupled to receive a data line of system data input and coupled to a data terminal of the data output of the built-in self-test circuit.

12. The memory of claim 8 wherein the built-in self-test circuit determines whether the memory includes a defective storage unit by performing operations that include writing data of the first bit width to the memory and reading data of the first bit width from the memory.

13. The memory of claim 1 wherein the built-in self-test circuit determines whether the memory includes a defective storage unit by performing operations under stress conditions.

14. A memory system comprising:
a memory including an array of memory storage units, read circuitry for providing digital outputs of data stored in the array, and a memory data output for providing digital data read by the read circuitry from the array at an addressable memory location, the memory data output being of a first bit width;
a system data output for providing data from an addressable memory location of the array indicated by an address received at a system address input, the system data output being of a second bit width less than the first bit width;
a built-in self-test circuit including a data input to receive data from the memory data output, the data input of the built-in self-test circuit having the first bit width, wherein the built-in self-test circuit is operably coupled to the memory to perform test operations on the memory to determine defective storage units of the memory;
a system data input to receive data to be written to the array at an addressable memory location indicated by an address received at the system address input, the system data input being of the second bit width;
wherein the memory includes a memory data input for receiving data to be written to the array at an addressable memory location, the memory data input being of the first bit width;
data line redirection circuitry for selectively redirecting at least one data line of the system data input from a corresponding data terminal of the memory data input based upon an indication of a determination by the built-in self-test circuit that a storage unit of the memory is defective.

15. A method of operating a memory system comprising:
performing memory test operations comprising:
writing by a built-in self-test circuit, data having a first bit width to a memory of a memory system, the memory receiving the data at a memory data input of the memory having the first bit width;
reading by the built-in self-test circuit, data having the first bit width from a memory data output of the memory, the memory data output being of the first bit width, the memory data output providing digital data;
wherein the memory system has a system data input and a system data output having a second bit width that is less than the first bit width.

16. The method of claim 15 further comprising:
configuring data line redirection circuitry based on an indication of a determination of at least one defective memory storage unit of the memory as a result of the performing the memory test operations, wherein the configuring includes configuring the data line redirection circuitry to provide data received from the system data input to terminals of the memory data input wherein a terminal of the memory data input associated with a defective storage unit is not provided data received from the system data input, and the configuring includes configuring the data line redirection circuitry to provide data provided to the system data output from terminals of the memory data output wherein data from a terminal of the memory data output associated with a defective storage unit is not provided to the system data output.

17. The method of claim 16 wherein after the configuring, the method comprising:
performing memory test operations comprising:
writing by the built-in self-test circuit, data to the memory data input, wherein the terminal of the memory data input associated with the defective storage unit does not receive the data;
reading by the built-in self-test circuit, data from the memory data output, wherein the built-in self-test circuit does not receive data from the terminal of the memory data output associated with the defective storage unit.

18. The method of claim 16 wherein the data line redirection circuitry includes a plurality of multiplexers, wherein the configuring includes controlling select lines of the plurality of multiplexers by writing data to a register by the built-in self-test circuit.

19. The method of claim 15 wherein the memory is characterized as a non repairable memory.

20. A memory system comprising:
a memory including an array of memory storage units, read circuitry for providing digital outputs of data stored in the array, and a memory data output for providing digital data read by the read circuitry from the array at an addressable memory location, the memory data output being of a first bit width;

a system data output for providing data from an addressable memory location of the array indicated by an address received at a system address input, the system data output being of a second bit width less than the first bit width;

a system data input to receive data to be written to the array at an addressable memory location indicated by an address received at the system address input, the system data input being of the second bit width, wherein the memory including a memory data input for receiving data to be written to the array at an addressable memory location including data received from the system data input, the memory data input being of the first bit width;

a built-in self-test circuit including a data input to receive data having the first bit width from the memory data output, the data input of the built-in self-test circuit having the first bit width, the built-in self-test circuit including a data output to provide data to the memory data input to write to the array, wherein the built-in self-test circuit is operably coupled to the memory to perform test operations on the memory to determine defective storage units of the array;

data line redirection circuitry configurable to provide data received from the system data input to terminals of the memory data input wherein terminals of the memory data input associated with defective storage units of the array as determined by the built-in self-test circuit are not provided data received from the system data input, and configurable to provide data provided to the system data output from terminals of the memory data output wherein data from terminals of the memory data output associated with defective storage units of the array determined by the built-in self-test circuit are not provided to the system data output.

* * * * *